US005719004A

United States Patent [19]

Lu et al.

[11] Patent Number: 5,719,004
[45] Date of Patent: Feb. 17, 1998

[54] POSITIVE PHOTORESIST COMPOSITION CONTAINING A 2,4-DINITRO-1-NAPHTHOL

[75] Inventors: Ping-Hung Lu, Bridgewater; Ralph R. Dammel, Flemington; Elaine G. Kokinda, Somerville; Sunit S. Dixit, Flemington, all of N.J.

[73] Assignee: Clariant Finance (BVI) Limited, Virgin Islands (Br.)

[21] Appl. No.: 695,157

[22] Filed: Aug. 7, 1996

[51] Int. Cl.⁶ .................................................. G03F 7/023
[52] U.S. Cl. .......................... 430/191; 430/165; 430/192; 430/193; 430/326; 430/330
[58] Field of Search ............................ 430/165, 191, 430/192, 193, 326, 330

[56] References Cited

U.S. PATENT DOCUMENTS

| | | | |
|---|---|---|---|
| 3,869,292 | 3/1975 | Peters | 96/115 |
| 4,439,516 | 3/1984 | Cernigliaro et al. | 430/323 |
| 4,871,644 | 10/1989 | Bauer | 430/191 |
| 4,883,739 | 11/1989 | Sakaguchi et al. | 430/191 |
| 4,889,788 | 12/1989 | Stahlhofen et al. | 430/191 |
| 5,225,312 | 7/1993 | Dixit et al. | 430/191 |
| 5,314,783 | 5/1994 | Koibuchi et al. | 430/191 |

OTHER PUBLICATIONS

"Dissolution Rate Modifying Chemistry: Interaction of Base–soluble and Base–Insoluble Non–actinic Dyes Novolak Polymers and Novolak–Based Positive Photoresists", Cernigliaro et al, SPIE vol. 1086, 1989.
Chapter 4 of Chemistry & Application . . . , Knap et al.
Chapter 7.4 of Light Sensitive Systems, Kosar.

Primary Examiner—John S. Chu
Attorney, Agent, or Firm—Sangya Jain

[57] ABSTRACT

A light-sensitive positive photoresist composition containing a film forming novolak resin, a quinone-diazide photoactive compound, a solvent, and a 2,4-dinitro-1-naphthol dye, where the dye is present at a level greater than 0.5 weight percent of the total photoresist composition. The dye reduces the linewidth variation of the resist pattern on a reflective substrate without significantly reducing the lithographic performance of the light-sensitive composition.

16 Claims, No Drawings

POSITIVE PHOTORESIST COMPOSITION CONTAINING A 2,4-DINITRO-1-NAPHTHOL

BACKGROUND OF THE INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives.

The photoresist is often applied to a reflective metal substrate surface and/or applied to a topographical surface of a semiconductor device during the photolithography process. The interference effect resulting from the reflected light from these reflective substrate during the exposure step may cause pattern linewidth variation, the problem is especially severe when the substrate surface is both highly reflective and topographical, since the light reflecting from such a surface is often unpredictable. This results in both a loss of fidelity of a reproductive resist pattern typically known as reflective notching and also in large variations in linewidth of the imaged photoresist pattern as the thickness of the photoresist over the substrate changes. The present invention is directed to the reduction of linewidth variation during the processing of these photoresists, especially over highly reflective topographical substrates.

The addition of dyes to photoresists has been suggested previously. The choice of dye in a photoresist is based on satisfying several important criteria, such as, compatability with the novolak/diazonaphthoquinone chemical system and the resist casting solvent, strong absorption at the exposure wavelength used to image-wise expose the resist, high extinction coefficient at the exposing wavelength and minimal impact on the lithographic performance of the photoresist. Some of these lithographic performance parameters are photosensitivity, resolution, sidewall edge acuity, and depth of focus. Typical photoresists that do not contain dyes exhibit reflective notching and large variations in the critical dimensions as the film thickness changes over topographical features in the substrate. As the circuitry on the semiconductor device becomes more sophisticated, more and more topography is being introduced on the substrate and the need for photoresists that can reduce the large variations of linewidth as the photoresist film thickness changes, known as linewidth swing ratio, is becoming critical. Reduction, or more preferably elimination, of this swing ratio provides a distinct process control advantage when choosing the preferred type of photoresist for use in manufacturing semiconductor devices. In the final choice of dyed photoresist all the lithographic characteristics mentioned above must be maximized to give the best performance and maximum process control.

The effect of the addition of dyes in photoresists, especially at high loading levels, and their impact on the lithographic performance on photoresists has been reported in "Interaction of base-soluble and base-insoluble non-actinic dyes with novolak polymers and novolac based positive photoresists" by George J. Cernigliaro et at, SPIE Vol. 1086, pages 106–116, 1989. These dyes, for example, coumarins and curcumin, have some negative impact on the performance of the resist, resulting in either loss of resolution, loss of edge acuity, loss of depth of focus, poor solubility, insufficient absorption at the actinic wavelength, insufficient reduction in reflected radiation, or any combination of these. One possible way of solving some of these issues is to use mixtures of dyes, as claimed in U.S. Pat. No. 5,225,312. However, the increased complexity of manufacturing and quality assurance, does not make the use of mixtures of dyes the most preferred method of solving these problems. The use of mixtures of dyes in U.S. Pat. No. 5,225,312, specifically, coumarin and 2,4-dinitro-1-naphthol, was necessitated by the need for the dyed photoresist to absorb the actinic radiation from a scanning exposure unit that emits radiation over a broad spectral range. Further, U.S. Pat. No. 5,225,312 does not recognize that any of these dyes alone would reduce the linewidth swing ratio when used with an I-line stepper. The current invention is directed to the use of significantly large quantities of a 2,4-dinitro-1-naphthol in photoresists, greater than 0.5%, by total weight of the photoresist composition, to reduce the linewidth swing ratio when exposing with an I-line stepper that emits radiation at 365 nm only.

Conventional dyes such as coumarin dyes or curcumin dyes have been widely used in novolak/diazonaphthoquinone type photoresist, however they cause severe loss in photosensitivity when used in positive photoresists. The dye of the current invention, a 2,4-dinitro-1-naphthol dye, although it is a strongly absorbing compound at i-line, its extinction coefficient at this exposure wavelength is relatively low compared to other i-line dyes such as Sudan Orange G dye and 2,2',4,4'-tetrahydroxybenzophenone. This results in a relatively higher dye loading being needed for the present invention to achieve a desired resist film absorbance as compared to other conventional i-line dyes. It has been unexpectedly found in the current invention that despite the use of relatively large quantities of a 2,4-dinitro-1-naphthol dye in the photoresist, greater than 0.5% by weight of the total photoresist composition, the linewidth swing ratio is significantly reduced without an expected loss of the other lithographic properties of the photoresist associated with a high loading of a dye.

SUMMARY OF INVENTION

The positive photoresist composition of the present invention is for reducing the variation of critical linewidth dimensions resulting from photoresist film thickness changes, known as linewidth swing ratio, where the photoresist composition comprises an admixture of a film-forming novolak resin, a quinone diazide photosensitizer, greater than about 0.5 weight percent of a 2,4-dinitro-1-naphthol and a solvent. The current invention further comprises a method of forming a photoresist image on a substrate using the novel photoresist composition of this invention.

DETAILED DESCRIPTION OF THE PREFERRED EMBODIMENT

The present invention provides for a light-sensitive positive photoresist composition comprising a film-forming novolak resin, a quinone-diazide photoactive compound, a solvent and a 2,4-dinitro-1-naphthol, at a level greater than 0.5% by weight of total photoresist, preferably from about 0.4% up to about 1.0%, by weight. The invention further provides for a process for coating and imaging the light-sensitive composition of this invention.

The production of film forming, novolak resins or polyvinylphenols, which may be used for preparing photosensitive compositions, are well known in the art. A procedure for the manufacture of novolak resins is described in Chemistry and Application of Phenolic Resins, Knop A. and Scheib, W.; Springer Verlag, N.Y., 1979 in Chapter 4 which is incorporated herein by reference. Paravinyl phenols and polyvinyl phenols are described in U.S. Pat. No. 3,869,292 and U.S. Pat. No. 4,439,516, which are incorporated herein by reference. Similarly, the use of o-diazonaphthoquinones as photoactive compounds is well known to the skilled artisan, as demonstrated by Light Sensitive Systems, Kosar, J.; John Wiley & Sons, N.Y., 1965 in Chapter 7.4, which is also incorporated herein by reference. These sensitizers which comprise a component of the present invention are preferably substituted diazonaphthoquinone sensitizers, which are conventionally used in the art in positive photoresist formulations. Such sensitizing compounds are disclosed, for example, in U.S. Pat. Nos. 2,797,213, 3,106, 465, 3,148,983, 3,130,047, 3,201,329, 3,785,825 and 3,802, 885. Useful photosensitizers include, but are not limited to, the sulfonic acid esters made by condensing phenolic compounds such as hydroxy benzophenones, oligomeric phenols and multisubstituted-multihydroxyphenyl alkanes with naphthoquinone-(1,2)-diazide-5-sulfonyl chloride or naphtho-quinone-(1,2)-diazide-4-sulfonyl chlorides.

In the preferred embodiment, the solid parts of the photoresist composition, the resin, the dye and the diazonaphthoquinone, preferably range from 15% to about 99% resin with from about 1% to about 85% diazonaphthoquinone. A more preferred range of resin would be from about 50% to about 90% and most preferably from about 65% to about 85% by weight of the solids photoresist components. A more preferred range of the diazonaphthoquinone would be from about 10% to about 50% and most preferably from about 15% to about 35%, by weight of the solid in the photoresist. In accordance with the present invention the amount of dye, 2,4-dinitro-1-naphthol, added to the light-sensitive composition ranges from about 0.45% to about 1.5%, and preferably from about 0.5% to about 1.0% by weight of total resist. In manufacturing the photoresist composition, the resin and the diazonaphthoquinone are mixed with the solvent, such that the solvent mixture is present in an amount of from about 40% to about 90% by weight of the overall photoresist composition. A more preferred range is from about 60% to about 83% and most preferably from about 65% to about 70% by weight of the overall photoresist composition.

Additives such as colorants, non-actinic dyes, antistriation agents, plasticizers, adhesion promoters, coating aids, speed enhancers and surfactants may be added to the solution of resin, sensitizer, 2,4-dinitro-1-naphthol and solvent system before the solution is coated onto a substrate.

Suitable solvents for such photoresists may include propylene glycol mono-alkyl ether, propylene glycol alkyl (e.g. methyl) ether acetate, ethyl-3-ethoxypropionate, xylene, diglyme, amyl acetate, ethyl lactate, butyl acetate, 2-heptanone, ethylene glycol monoethyl ether acetate, and mixtures thereof.

The prepared photoresist composition solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to aluminum/ aluminum oxide coated wafers, such as are utilized in the production of microprocessors and other miniaturized integrated circuit components. A silicon/silicon dioxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photosensitizer. In general, one desires to minimize the concentration of solvents and this first temperature treatment is conducted until substantially all of the solvents have evaporated and a thin coating of photoresist composition, on the order of one micron (micrometer) in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm (nanometers) to about 450 nm, x-ray, electron beam, ion beam or laser radiation, in any desired pattern, produced by use of suitable masks, negatives, stencils, templates, etc.

The photoresist is then optionally subjected to a post exposure second baking or heat treatment either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLE 1

Dyed resist samples were prepared by adding various amounts of dye to a commercial i-line positive photoresist AZ® 7700 (available from Hoechst Celanese Corporation, AZ Photoresist Products Division, 70 Meister Ave, Somerville, N.J. 08876). The quantity of each dye under investigation was determined so that the final resist film absorbance for a 1 µm (micrometer) film at 365 nm was the same and the dye loading for each resist is given in the Table 1 below. In addition to a 2,4 dinitro-1-naphthol (present invention), typical i-line sensitive dyes such as 2,2',4,4'-tetrahydroxybenzophenone and Sudan Orange G described in the prior art were included for comparison.

For UV (ultraviolet) film absorbance measurement, each resist sample was spin coated on a 4" quartz wafer then soft baked (SB) on a hot plate at 90° C. for 60 seconds to a film thickness of 1 µm (micrometer). The resist film thickness was measured with a NanoSpec® AFT thickness measurement tool. The UV absorbance of each resist at 365 nm was measured with a Perkin Elmer® Lamda® 4 UV-VIS spectrometer using a blank quartz as the reference.

For the CD swing or linewidth swing ratio measurement, each resist sample was spin coated on several 4" aluminum wafers using a SVC® track coater. The coated wafers were soft baked on a hot plate at 90° C. for 60 seconds to achieve film thickness of 0.74–1.14 µm (micrometers). Resist film thickness was measured with a NanoSpec® AFT thickness measurement tool. The coated wafers were exposed on a NIKON® 0.54 NA i-line stepper with a NIKON® resolution reticle which contained various sizes of lines and spaces (L/S) pattern from 2 to 0.2 µm (micrometers). A 15×21 focus/exposure array was printed on the wafer and then post exposure baked (PEB) on a hot plate at 110° C. for 60 seconds. The exposed wafers thus produced were spray-puddle developed with 2.38% TMAH MIF (metal ion free) developer for 70 seconds at 23° C. The minimum exposure dose required to reproduce the 0.4 µm (micrometers) line pattern at the best stepper focus was reported as the dose-to-print (DTP). At the DTP, the 0.4 µm (micrometers) linewidth, known as critical dimension (CD), of each wafer was measured with an in-line linewidth measurement tool on a HITACHI® S-4000 field emission scanning electron microscope (SEM). The CD measurement of each wafer was plotted as a function of resist film thickness. A sinusoidal curve was obtained where the difference of the CD measured at the adjacent maximum (at the resist thickness of ca. 1.02 µm (micrometers)) and minimum (at the resist thickness of ca. 1.08 µm (micrometers)) of the sinusoidal curve was reported as the CD swing of each dyed resist.

For reflective notching evaluation, each resist was coated with a thickness of 0.8 µm on a wafer with 0.75 µm high aluminum lines and spaces pattern. The process conditions for wafer imaging was the same as the one described above.

The resist linewidth variation over the aluminum steps was measured on a HITACHI®-S4000 SEM and reported as the resist reflective notching.

TABLE 1

Summary of the direct lithographic comparison of the three dyes tested

| Dye | Extinction Coefficient @ 365 nm | Dye loading Wt. % | Film Absorbance/ μ @ 365 nm | DTP mJ/cm² | CD Swing Reduction from Control | Reflective Notching |
| --- | --- | --- | --- | --- | --- | --- |
| None | Control | 0 | — | 240 | 0 | Yes |
| A[1] | 13,548 | 0.59 | 0.538 | 290 | 22.6% | None |
| B[2] | 9,567 | 0.97 | 0.536 | 300 | 30% | None |
| C[3] | 21,235 | 0.44 | 0.534 | 290 | 24.5% | None |

1. Dye A: 2,2',4,4' tetrahydroxybenzophenone
2. Dye B: 2,4-dinitro-1-naphthol
3. Dye C: Sudan Orange G
mJ = millijoules It is clearly seen in Table 1 that dye B, the present invention, although with almost twice the loading of the two other conventional i-line dyes (dyes A and C) did not suffer from severe loss of photosensitivity as would be expected for a heavily dyed resist. Dye B also offers excellent reflective notching control and, unexpectedly, the best CD swing reduction.

EXAMPLE 2

Dyed resist samples were prepared by adding various amounts of dye B as well as dye C to a commercial i-line positive photoresist, AZ® 7700 resist, (available from Hoechst Celanese Corporation, AZ Photoresist Products Division, 70 Meister Ave, Somerville, N.J. 08876). The dye loading of each resist is given in the Table 2 below. Each resist sample was spin coated to a thickness of 1.073 μm (micrometers) and image-wise exposed using the same process conditions described in the Example 1. The DTP and CD swing reduction were determined by the same method as described in Example 1. Table 2 lists the lithographic performance of each of the dyed resists.

TABLE 2

Effect of dye loading on resist lithographic performance

| Resist | Dye loading Wt. % | DTP mJ/cm² | Resolution (μm) | Exposure latitude 0.4 μm, L/S | DOF 0.4 μm L/S | CD Swing Reduction from Control |
| --- | --- | --- | --- | --- | --- | --- |
| Az ® 7700 Resist (Control) | 0 | 240 | 0.34 | 25% | 1.0 | 0 |
| A[1] | 0.485 | 290 | 0.34 | 22.4% | 0.8 | 15% |
| B[1] | 0.679 | 290 | 0.34 | 22.4% | 0.8 | 28% |
| C[1] | 0.97 | 300 | 0.36 | 33% | 0.6 | 32% |
| D[1] | 1.067 | 330 | 0.36 | 16.7% | 0.4 | 42% |
| E[2] | 0.44 | 290 | 0.34 | 26.7% | 0.8 | 24.5% |
| F[2] | 0.645 | 390 | 0.36[3] | 24.3% | 0.4 | 50% |

1. Resist A, B, C, D contain 2,4-dinitro-1-naphthol
2. Resist E & F contain Sudan Orange G
3. microgrooving observed
DOF = Depth of Focus, expressed in microns (μm)

As can be seen in Table 2, at a dye loading of greater than 0.5 weight %, 2,4-dinitro-1-naphthol, the present invention, gives the desired CD swing reduction without significant degradation in resist performance. The improvement of CD swing reduction increases as the dye loading increases until the dye loading exceeds 0.97 weight % of resist (about 1%), where degradation of resist performance starts to become significant. On the contrary, photoresist containing Sudan orange G dye at levels greater than 0.5% exhibited severe loss of resist performance, specifically in photosensitivity, resolution, presence of microgrooving, and DOF. Even though the CD swing is improved at Sudan orange G levels greater than 0.5%, the photoresist is not useable.

We claim:

1. A positive photoresist composition for reducing linewidth swing ratio, consisting essentially of an admixture of a film-forming novolak resin, a quinone diazide photosensitizer, greater than about 0.5 weight percent of a 2,4-dinitro-1-naphthol, and a photoresist solvent.

2. The photoresist composition according to claim 1 wherein the photoresist solvent is selected from a group consisting of propylene glycol mono-alkyl ether, propylene glycol methyl ether acetate, 2-heptanone, butyl acetate, amyl acetate, ethyl-3-ethoxypropionate, ethyl lactate, ethylene glycol monoethyl ether acetate, ethyl lactate, and mixtures thereof.

3. The composition of claim 1 wherein the photosentizer is present in an amount of from about 1 to about 35 weight percent and the novolak resin is present in an amount from about 65 to about 95 weight percent, based on the non-solvent components of the photoresist composition.

4. The composition of claim 1 wherein the amount of 2,4-dinitro-1-naphthol in the photoresist composition ranges from about 0.5 weight percent to about 1.5 weight percent of the total weight of the photoresist composition.

5. The composition of claim 1 further comprising one or more additives selected from the group consisting of colorants, leveling agents, anti-striation agents, plasticizers, adhesion promoters, speed enhancers and surfactants.

6. The photoresist composition according to claim 1 wherein the quinone-diazide photosensitizer is a reaction product of a diazonaphthoquinone sulfonyl residue and a phenolic residue.

7. The photoresist composition according to claim 6 wherein the phenolic residue is selected from a group consisting of multihydroxybenzophenones, multihydroxyphenylalkanes, phenolic oligomers, and mixtures thereof.

8. The photoresist composition according to claim 6 wherein the naphthoquinone sulfonyl residue is selected from a group consisting of 2,1,4-diazonaphthoquinone sulfonyl, 2,1,5- diazonaphthoquinone sulfonyl, or mixtures thereof.

9. The photoresist composition according to claim 1 wherein the novolak resin is an acid catalysed condensation product of an aldehyde and one or more substituted phenolic monomers.

10. A method for producing a photoresist image on a substrate, which comprises:
   a) coating a substrate with a positive photoresist composition for reducing linewidth swing ratio, which photoresist consisting essentially of an admixture of a film-forming novolak resin, a quinone diazide photosensitizer, greater than about 0.5 weight percent of a 2,4-dinitro-1-naphthol and a solvent;
   b) heat treating the coated substrate until substantially all of said solvent composition is removed;
   c) imagewise exposing the coated photoresist composition to actinic radiation;
   d) removing the imagewise exposed areas of said coated photoresist composition with a developer; and
   e) optionally, heating the substrate either before or after the removing step.

11. The method of claim 10 further comprising heating said coated substrate from a temperature of from about 90° C. to about 150° C. for from about 30 seconds to about 180 seconds on a hot plate or from about 15 minutes to about 40 minutes in an oven after the exposure step but before the removing step.

12. The method of claim 10 further comprising heating said coated substrate at a temperature of from about 90° C. to about 150° C. for about 30 second to about 180 seconds on a hot plate or for from about 15 minutes to about 40 minutes in an oven after the removing step.

13. The method of claim 10 wherein said substrate comprises one or more components selected from the group consisting of silicon, aluminum, polymeric resins, silicon dioxide, doped silicon dioxide, silicon nitride, tantalum, copper, polysilicon, ceramics, aluminum/copper mixtures, gallium arsenide and Group III/V compounds.

14. The method of claim 10 wherein the exposure step is conducted with ultraviolet radiation having a wavelength of about 365 nm.

15. The method of claim 10 wherein the developer is an aqueous alkaline solution.

16. The method of claim 10 wherein the developer is an aqueous solution of tetramethylammonium hydroxide.

* * * * *